United States Patent
Kim et al.

(10) Patent No.: US 11,391,999 B2
(45) Date of Patent: Jul. 19, 2022

(54) DISPLAY DEVICE AND METHOD OF MANUFACTURING THE SAME

(71) Applicant: Samsung Display Co., Ltd., Yongin-Si (KR)

(72) Inventors: Ha Sook Kim, Hwaseong-si (KR); Deok-Hwan Kim, Asan-si (KR); Sung-Jun Kim, Hwaseong-si (KR); Yun-Tae Kim, Seoul (KR); Jeong Hyun Kim, Seongnam-si (KR); Kenneth Lee, Asan-si (KR); Hyong Do Choi, Anseong-si (KR)

(73) Assignee: Samsung Display Co., Ltd.

( * ) Notice: Subject to any disclaimer, the term of this patent is extended or adjusted under 35 U.S.C. 154(b) by 222 days.

(21) Appl. No.: 16/805,475

(22) Filed: Feb. 28, 2020

(65) Prior Publication Data

US 2021/0072582 A1    Mar. 11, 2021

(30) Foreign Application Priority Data

Sep. 6, 2019 (KR) .......................... 10-2019-0110794

(51) Int. Cl.
   *H01L 51/00* (2006.01)
   *H01L 27/32* (2006.01)
   *G02F 1/1345* (2006.01)

(52) U.S. Cl.
   CPC ...... *G02F 1/13452* (2013.01); *H01L 27/3276* (2013.01); *H01L 51/0097* (2013.01)

(58) Field of Classification Search
   CPC ............ G02F 1/13452; G02F 1/13458; G02F 1/133351; G02F 1/136286; H01L 27/3276; H01L 51/0097; H01L 51/0096; Y02E 10/549; H05K 1/028; H05K 1/116; H05K 3/323; H05K 3/361
   See application file for complete search history.

(56) References Cited

U.S. PATENT DOCUMENTS

2011/0170303 A1* 7/2011 Wu .................. H01L 23/147
                                                     362/382

FOREIGN PATENT DOCUMENTS

| KR | 10-2009-0030462 A | 3/2009 |
| KR | 10-2015-0145827 A | 12/2015 |
| KR | 10-1910841 B1 | 10/2018 |
| KR | 10-2019-0043732 A | 4/2019 |

* cited by examiner

*Primary Examiner* — Kyoung Lee
(74) *Attorney, Agent, or Firm* — Innovation Counsel LLP

(57) ABSTRACT

A display device includes a display panel, and a first flexible printed circuit board bonded to a side surface of the display panel. The display panel includes: a first substrate; a first extension wire on a top surface of the first substrate, the top surface being parallel to a first direction and a second direction, the second direction being perpendicular to the first direction; a first recess portion at a side surface of the first substrate; and a first pad that extends from the first extension wire in a third direction perpendicular to the first and second directions, the first pad being disposed in the recess portion, and the first extension wire and the first pad comprise the same material.

19 Claims, 16 Drawing Sheets

DISPLAY DEVICE AND METHOD OF MANUFACTURING THE SAME

CROSS-REFERENCE TO RELATED APPLICATION

This application claims priority to and the benefit of Korean Patent Application No. 10-2019-0110794 filed in the Korean Intellectual Property Office on Sep. 6, 2019, the entire contents of which are incorporated herein by reference.

BACKGROUND

1. Field

The described technology relates generally to a display device and a manufacturing method of the display device.

2. Description of the Related Art

Various display devices such as a liquid crystal display (LCD), an organic light emitting diode display (OLED), a quantum-dot display device, and similar display devices include a display panel where pixels that can display an image are formed, and a driving circuit that can drive the display panel.

The display panel includes a display area in which pixels are formed. A bezel area, which is a peripheral area where an image is not displayed, may be positioned around the display area. Various driving circuits and wires may be located in the bezel area.

Recently, research and development on side bonding technology that bonds integrated circuits (ICs), other printed circuits, and wires to the side of the display panel to reduce the non-display peripheral area have been actively conducted.

The above information disclosed in this Background section is only for enhancement of understanding of the background of the described technology and therefore it may contain information that does not form the prior art that is already known in this country to a person of ordinary skill in the art.

SUMMARY

Embodiments have made in an effort to provide a display device in which wires at a front side of the display device and a pad at a side surface of the display device can be formed together. The wires and the pad are formed together without additional processes for polishing a side surface of a display panel after cutting a mother board and forming pads at a side surface of the display device. In this manner, the process is simplified and the manufacturing cost is reduced.

In addition, the embodiments aim to provide a display device that can prevent short-circuit of wires by increasing a contact area of a pad located on the side of the display device. Preventing short-circuit of wires prevents occurrence of defects, and improves efficiency by reducing contact resistance.

A display device according to an embodiment includes: a display panel; and a first flexible printed circuit board that is bonded to a side surface of the display panel, wherein the display panel includes: a first substrate; a first extension wire on a top surface of the first substrate, the top surface being parallel to a first direction and a second direction, the second direction being perpendicular to the first direction; a first recess portion that is disposed at a side surface of the first substrate; and a first pad that extends from the first extension wire in a third direction perpendicular to the first and second directions, the first pad being disposed in the first recess portion, and the first extension wire and the first pad comprise the same material.

The display panel may further include a data line that transmits a data voltage, and, the first extension wire may be disposed in the same layer as the data line.

The display panel may further include a gate line that transmits a gate signal, and the first extension wire is disposed in the same layer as the gate line.

The first flexible printed circuit board may be bonded to the first recess portion and is connected with the first pad.

The display device according to an embodiment may further include a second flexible printed circuit board that is bonded to a side surface of the display panel, wherein the display panel may further include: a second recess portion at the side surface of the first substrate; a second extension wire on the top surface of the first substrate; and a second pad that extends in the third direction from the second extension wire, the second pad being disposed in the second recess portion, and the second flexible printed circuit board may be bonded to the second recess portion and may be connected with the second pad.

The display panel may further include a first protrusion that is disposed between the first recess portion and the second recess portion.

The display device according to an embodiment may further include an anisotropic conductive film that is disposed between the first flexible printed circuit board and the first pad.

The display device according to an embodiment may further include a second flexible printed circuit board that is bonded to the side surface of the display panel, wherein the second flexible printed circuit board may be bonded to the first recess portion.

The first flexible printed circuit board may include a driver integrated circuit (IC).

A manufacturing method of a display device according to an embodiment includes: forming penetration holes along a cutting line of a mother board; forming a conductive layer and a photoresist layer on the mother board; forming a photoresist pattern by developing and exposing the photoresist layer; forming a conductive pattern by etching the conductive layer; and cutting the mother board along the cutting line so as to pass through the penetration holes.

The conductive layer may be disposed on a top surface of the mother board and may be disposed on inner walls of the penetration holes, the forming the conductive pattern comprising the etching the conductive layer.

In the forming the conductive pattern, an extension wire may be formed on the mother board, and pads may be formed in the inner walls of the penetration holes.

In the forming of the conductive layer, data lines and the pads may be simultaneously formed on the mother board.

In the forming of the conductive pattern, gate lines and the pads may be simultaneously formed on the mother board.

In the cutting of the mother board, the mother board is cut into unit boards, and each unit board may include a first recess portion formed by cutting a first penetration hole among the penetration holes.

In the cutting of the mother board, the unit board may include a second recess portion formed by cutting a second penetration hole among the penetration holes.

The manufacturing method of the display device may further include bonding a flexible printed circuit board after the cutting of the mother board, wherein the bonding the flexible printed circuit board may be carried out by bonding a first flexible printed circuit board to the first recess portion and bonding a second flexible printed circuit board to the second recess portion.

In the cutting of the mother board, a protrusion may be formed between the first recess portion and the second recess portion.

The manufacturing method of the display device may further include bonding flexible printed circuit boards to the first recess portion after the cutting of the mother board.

The bonding the flexible printed circuit board may be carried out by positioning an anisotropic conductive film between the flexible printed circuit board and the pads and performing compression at a high pressure or a high temperature.

According to the embodiments, wires at a front side of the display device and a pad at a side surface of the display device can be formed together. The wires and the pads are formed together without additional processes for polishing a side surface of a display panel after cutting a mother board and forming pads at a side surface of the display device. In this manner, the process is simplified and the manufacturing cost is reduced.

In addition, the embodiments aim to provide a display device that can prevent short-circuit of wiring by increasing a contact area of a pad located on the side of the display device. Preventing short-circuit of wires prevents occurrence of defects, and improves efficiency by reducing contact resistance.

DETAILED DESCRIPTION

Figure 1:
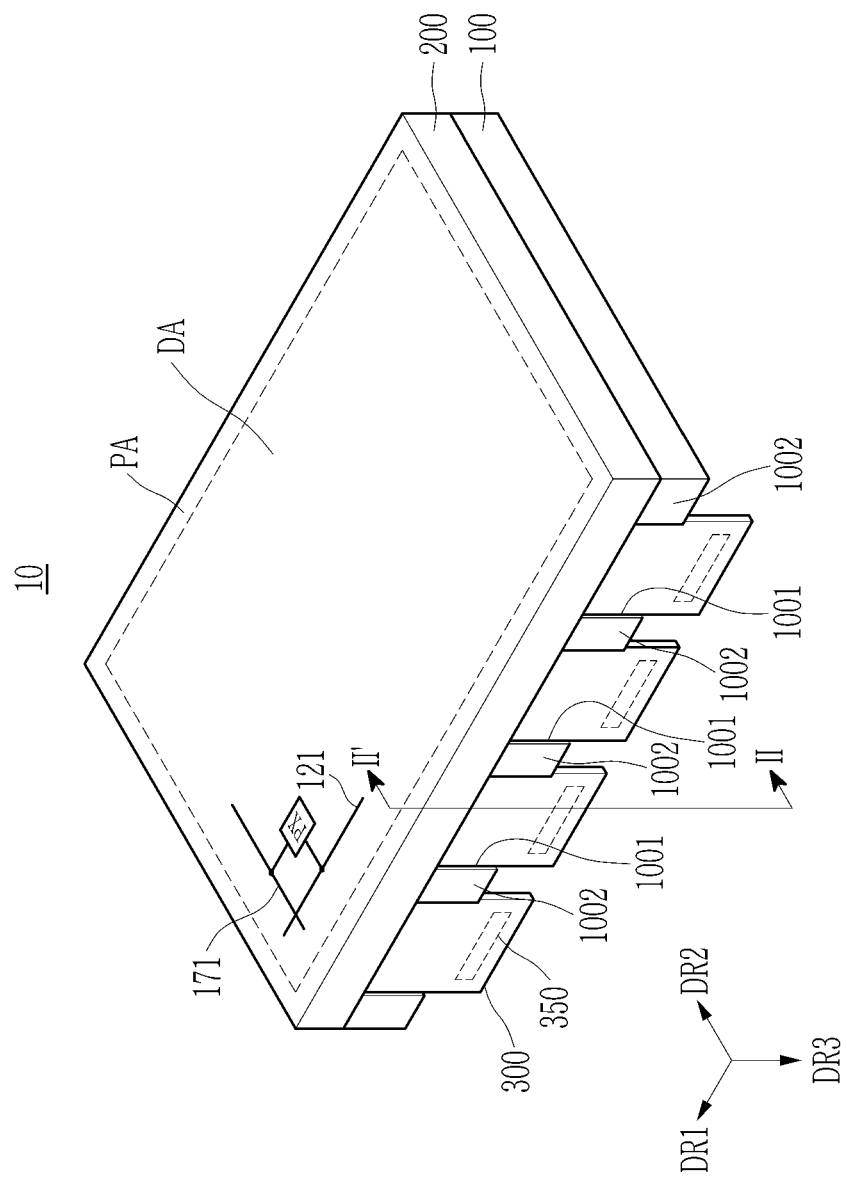
FIG. 1 is a perspective view of a display device according to an embodiment.

The inventive concept will be described more fully hereinafter with reference to the accompanying drawings, in which embodiments are shown. As those skilled in the art would realize, the described embodiments may be modified in various different ways, all without departing from the spirit or scope of the inventive concept.

The drawings and description are to be regarded as illustrative in nature and not restrictive. Like reference numerals designate like elements throughout the specification.

Further, in the drawings, size and thickness of each element are arbitrarily represented for better understanding and ease of description. In the drawings, the thickness of layers, films, panels, regions, etc., are exaggerated for clarity. In the drawings, for better understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to be positioned above or below the target element, and will not necessarily be understood to be positioned "at an upper side" based on a gravity opposite direction.

In addition, unless explicitly described to the contrary, the word "comprise" and variations such as "comprises" or "comprising" will be understood to imply the inclusion of stated elements but not the exclusion of any other elements.

In addition, in this specification, the phrase "on a plane" means viewing a target portion from the top, and the phrase "on a cross-section" means viewing a cross-section formed by vertically cutting a target portion from the side.

Hereinafter, a display device 10 according to an embodiment will be described with reference to FIG. 1. FIG. 1 is a perspective view of the display device 10 according to an embodiment.

The display device 10 according to an embodiment includes display panels 100 and 200 and a flexible printed circuit board 300. The display panels 100 and 200, sometimes called the first display panel 100 and the second display panel 200, respectively, face each other.

The display device 10 according to the embodiment may be a liquid crystal display (LCD) in which a liquid crystal layer 3 (see FIG. 2) is positioned between the first display panel 100 and the second display panel 200. Alternatively, the display device 10 according to the embodiment may be an organic light emitting diode display (OLED) including an organic light emitting diode. In this case, at least one of the first display panel 100 and the second display panel 200 may include a touch electrode (not shown) capable of sensing a touch from the outside.

The display panels 100 and 200 of the display device 10 according to the embodiment include a display area DA displaying an image and a peripheral area PA positioned around the display area DA and not displaying an image. The peripheral area PA may be positioned to surround the display area DA.

Pixels PX and signal lines are disposed in the display area DA.

As a unit that can display an image, the pixel PX may include at least one pixel electrode, and emits light having a luminance corresponding to a gray level of an input image signal.

The signal lines include gate lines 121 and data lines 171. The gate lines 121 and the data lines 171 may be disposed to cross each other while being insulated from each other. The gate line 121 extends in the first direction DR1 and is connected to the pixel PX to transmit a gate signal. The data line 171 extends in a second direction DR2 and is connected to the pixel PX to transmit a data voltage corresponding to an image signal. The first direction DR1 and the second direction DR2 cross each other and are perpendicular. The first direction DR1 and the second direction DR2 may be parallel to the plane directions including top surfaces of the display panels 100 and 200.

Recess portions 1001 and protrusions 1002 that are alternately disposed are positioned at a side surface of the first display panel 100. The recess portion 1001 is a groove formed in the side surface of the first display panel 100, and the protrusion 1002 is a portion that protrudes relative to the recess portion 1001.

The flexible printed circuit board 300 is bonded to the recess portion 1001 of the first display panel 100. Each flexible printed circuit board 300 includes a driver integrated circuit (IC) 350. The protrusion 1002 of the first display panel 100 is disposed between flexible printed circuit boards 300. The driver IC 350 may be a gate driver IC that generates a gate signal. In this case, the driver IC 350 may be electrically connected with the gate line 121 of the display area DA.

Unlike this, the driver IC 350 of the flexible printed circuit board 300 may be a data driver IC that generates a data voltage, which is a gray voltage corresponding to an input image signal. In this case, the driver IC 350 may be electrically connected with the data line 171 of the display area DA.

Depending on embodiments, the gate driver is formed at the same time as the manufacturing process of transistors that drive the pixels PX, and is thus mounted in the first display panel 100 in the form of an amorphous silicon TFT gate driver circuit (ASG) or an oxide silicon TFT gate driver circuit (OSG).

In FIG. 1, the flexible printed circuit board 300 is disposed further inside than the protrusion 1002, but this is not restrictive. One side of the flexible printed circuit board 300 may protrude more than the protrusion 1002.

Figure 2:
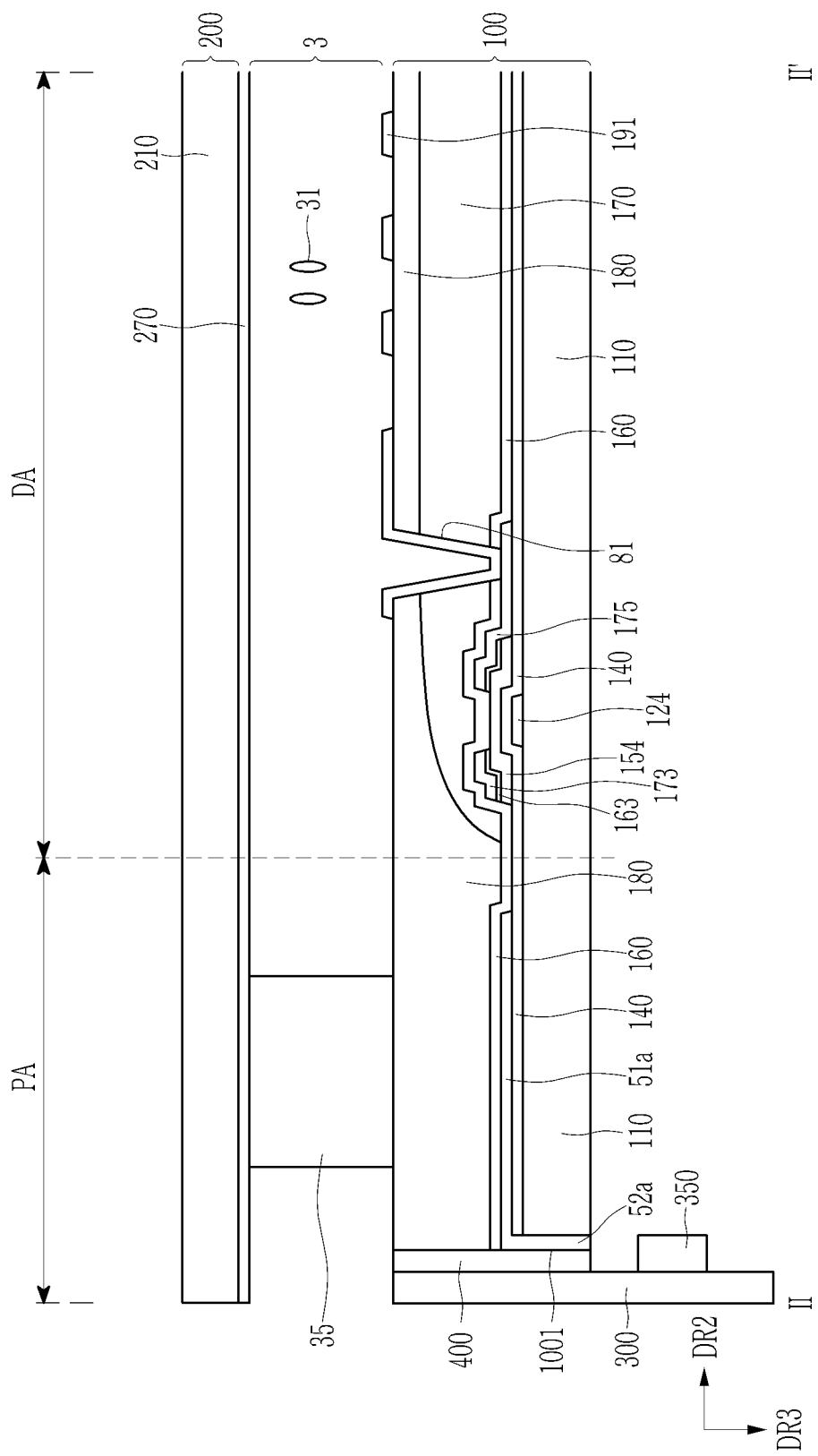
FIG. 2 is a cross-sectional view of the display device of FIG. 1, taken along the line II-II' according to an embodiment.

Hereinafter, the display device 10 according to the embodiment will be described with reference to FIG. 2. FIG. 2 is a cross-sectional view of FIG. 1, taken along the line II-II'. In FIG. 2, the display device 10 of FIG. 1 will be exemplarily described as a liquid crystal display (LCD).

Referring to FIG. 2, the first display panel 100 includes a first substrate 110. A first wiring layer that includes the gate line 121 and a gate electrode 124 is disposed on the first substrate 110. The first wiring layer may include a metal such as molybdenum, aluminum, silver, copper, molybdenum, chromium, tantalum, titanium, or an alloy of one or more of the metals.

A gate insulation layer 140 is disposed on the first wiring layer. A semiconductor layer 154 is disposed on the gate insulation layer 140. The semiconductor layer 154 may include an amorphous silicon, an oxide semiconductor, and the like.

A second wiring layer that includes the data line, a source electrode 173, and a drain electrode 175 is disposed on the semiconductor layer 154. An ohmic contact 163 is disposed between the semiconductor layer 154 and the data line 171, and between the source electrode 173 and the drain electrode 175. The second wiring layer may include a metal such as molybdenum, chromium, copper, aluminum, tantalum, titanium, or an alloy of one or more of the metals.

The second wiring layer further includes a first extension wire 51a and a first pad 52a that are disposed in the peripheral area PA. The first extension wire 51a may be positioned on the top surface of the first substrate 110, and may be connected to the first wiring layer or the second wiring layer of the display area DA. When the first extension wire 51a is connected to the first wiring layer, the first extension wire 51a may be connected to the first wiring layer through an opening (not shown) positioned in the gate insulation layer 140.

The first pad 52a extends from the first extension wire 51a, and extends in a third direction DR3 from the recess portion 1001 positioned on the side of the first display panel 100. The third direction DR3 is perpendicular to the first and second direction DR1, DR2. In this case, the first pad 52a may extend along the side surface of the gate insulation layer 140 or the first substrate 110. The first pad 52a may be formed together with the second wiring layer, and thus may include the same material as the first extension wire 51a and the data line 171.

The gate electrode 124, the source electrode 173, and the drain electrode 175 form a thin film transistor (TFT) together with the semiconductor layer 154, and a channel of the thin film transistor may be disposed in the semiconductor layer 154 between the source electrode 173 and the drain electrode 175.

A first insulation layer 160 is disposed on the gate insulation layer 140, the source electrode 173, and the drain electrode 175.

A color filter 170 is disposed on the first insulation layer 160. The color filter 170 may include a red color filter, a green color filter, and a blue color filter. The color filter 170 is included in the first display panel 100 in FIG. 2, but the color filter 170 may be included in the second display panel 200.

An organic insulator 180 is disposed on the color filter 170. An opening 81 that extends to and exposes the drain electrode 175 is disposed in the first insulation layer 160, the color filter 170, and the organic insulator 180.

A pixel electrode 191 is positioned on the organic insulation layer 180 in the display area DA. The pixel electrode 191 is connected to the drain electrode 175 through the opening 81.

The pixel electrode 191 may include a transparent conductive material such as ITO, IZO, or the like.

A sealant 35 is positioned on the organic insulation layer 180 in the peripheral area PA. The sealant 35 may be positioned to surround the display area DA in the peripheral area PA, and seal liquid crystal molecules 31 of the liquid crystal layer 3 to be described later.

Hereinafter, the second display panel 200 will be described.

The second display panel 200 includes a second substrate 210. A common electrode 270 is disposed below the second substrate 210. The common electrode 270 is connected with a common voltage line (not shown) and receives a common voltage. The common electrode 270 may include a transparent conductive material such as ITO, IZO, and the like.

The liquid crystal layer 3 is disposed between the first display panel 100 and the second display panel 200. The liquid crystal layer 3 includes the liquid crystal molecules 31. The liquid crystal molecules 31 may be aligned by an electric field generated by voltages applied to the pixel electrode 191 and the common electrode 270, and thus, gray levels may be expressed by adjusting polarization of incident light. The liquid crystal molecules 31 may have negative dielectric anisotropy, and in a state in which there is no electric field in the liquid crystal layer 3, the liquid crystal molecules 31 may be aligned such that the long axes of the liquid crystal molecules 31 are generally inclined perpendicularly to or at a predetermined angle perpendicular to the surface of the first substrate 110.

An alignment layer (not shown) may be positioned between the pixel electrode 191 and the liquid crystal layer 3 and between the common electrode 270 and the liquid crystal layer 3.

The flexible printed circuit board 300 is positioned to face the first pad 52a in the recess portion 1001 of the first display panel 100. An anisotropic conductive film 400 is positioned between the flexible printed circuit board 300 and the first display panel 100. The anisotropic conductive film 400 may include conductive balls, and may electrically connect the flexible printed circuit board 300 and the first pad 52a of the first display panel 100.

Figure 3:
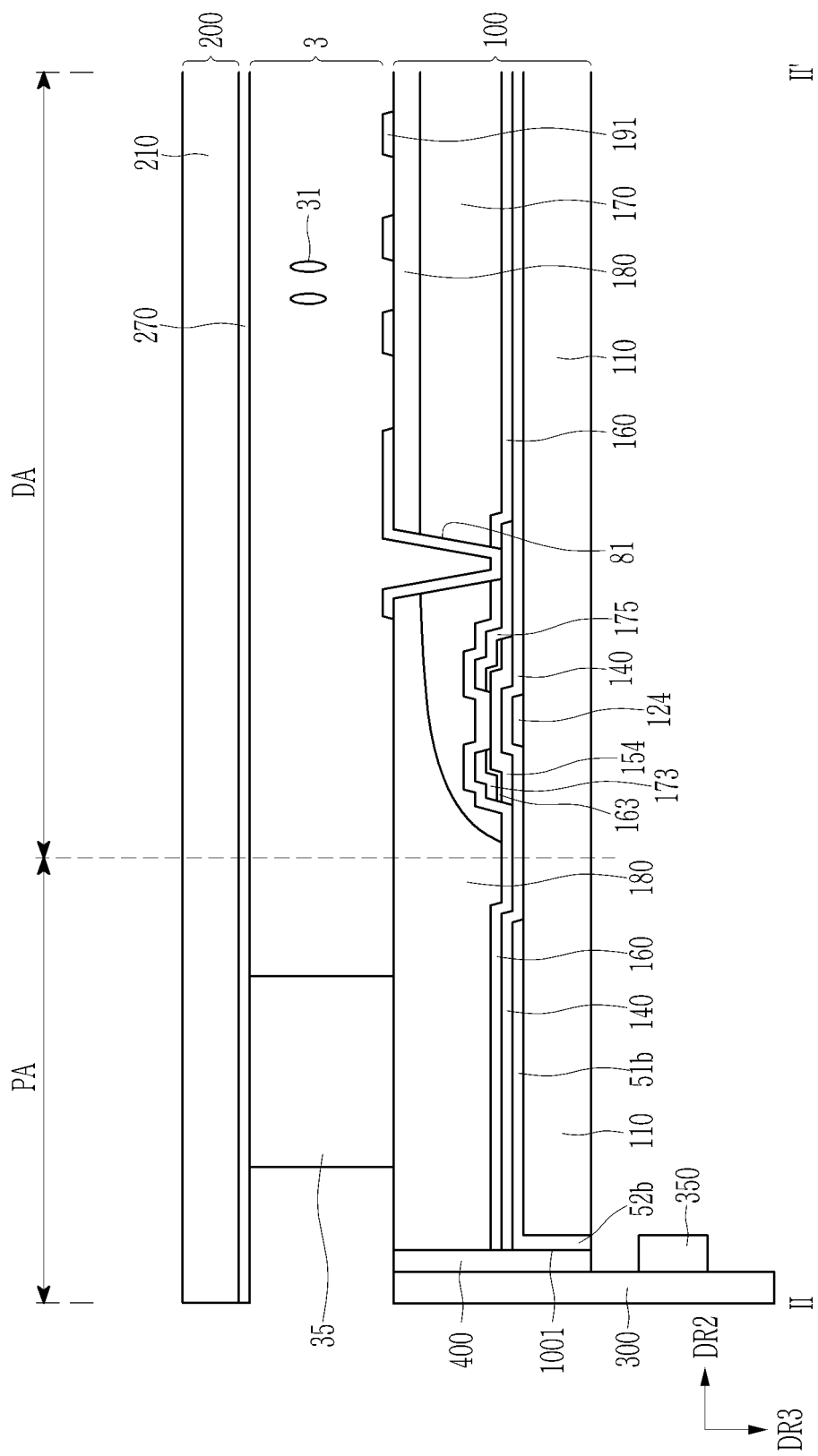
FIG. 3 is a cross-sectional view of the display device of FIG. 1, taken along the line II-II' according to an embodiment.

Hereinafter, the display device 10 according to an embodiment will be described with reference to FIG. 3. FIG. 3 is a cross-sectional view of the display device according to an embodiment. Specifically, FIG. 3 is a cross-sectional view of the display device according to an embodiment of FIG. 1, taken along the line II-If.

Referring to FIG. 3, the first wiring layer further include a second extension wire 51b and a second pad 52b that are disposed in the peripheral area PA. The second extension wire 51b is positioned on the top surface of the first substrate 110, and may be connected to the first wiring layer or the second wiring layer of the display area DA. When the second extension wire 51b is connected to the second wiring layer, the second extension wire 51b may be connected to the second wiring layer through an opening (not shown) positioned in the gate insulation layer 140.

The second pad 52b extends from the second extension wire 51b, and extends in the third direction DR3 from the recess portion 1001 positioned on the side of the first display panel 100. In this case, the second pad 52b may extend along the side surface of the first substrate 110. The second pad 52b may be formed together when the first wiring layer is formed, and thus may include the same material as the second extension wire 51b and the gate line 121.

Figure 4:
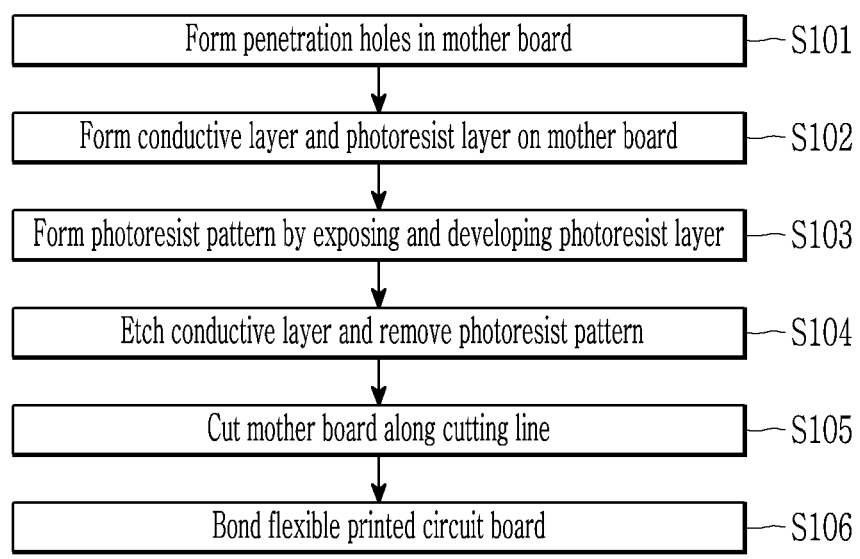
FIG. 4 is a flowchart of a manufacturing method of a display device according to an embodiment.

Hereinafter, a manufacturing method of a display device according to an embodiment will be described with reference to FIG. 4 to FIG. 12. FIG. 4 is a flowchart of a manufacturing method of a display device according to an embodiment. FIG. 5 to FIG. 12 show process stages of the manufacturing method of the display device according to the embodiment.

Figure 5:
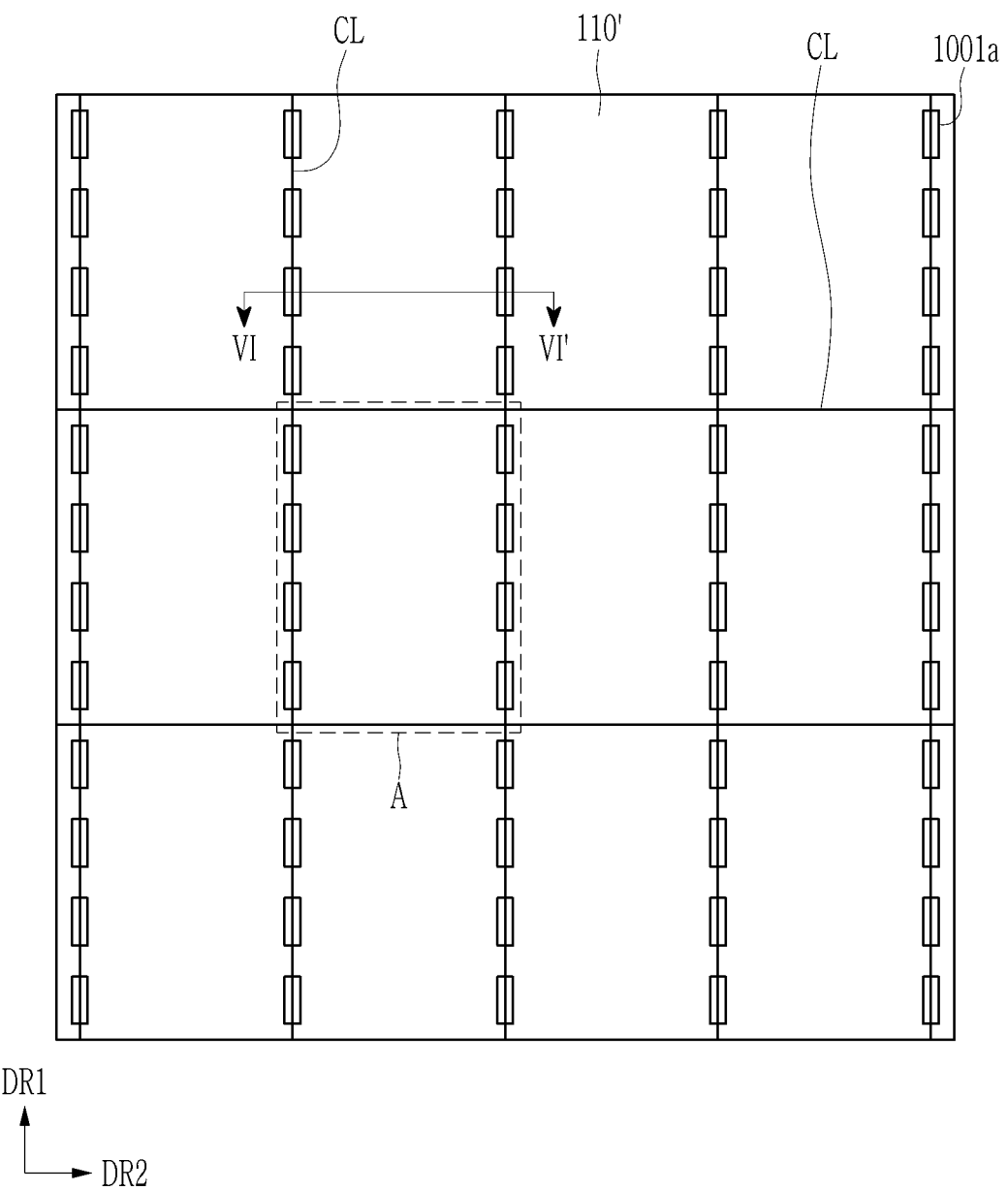
FIG. 5 is a top plan view of a mother board according to an embodiment.
Figure 6:
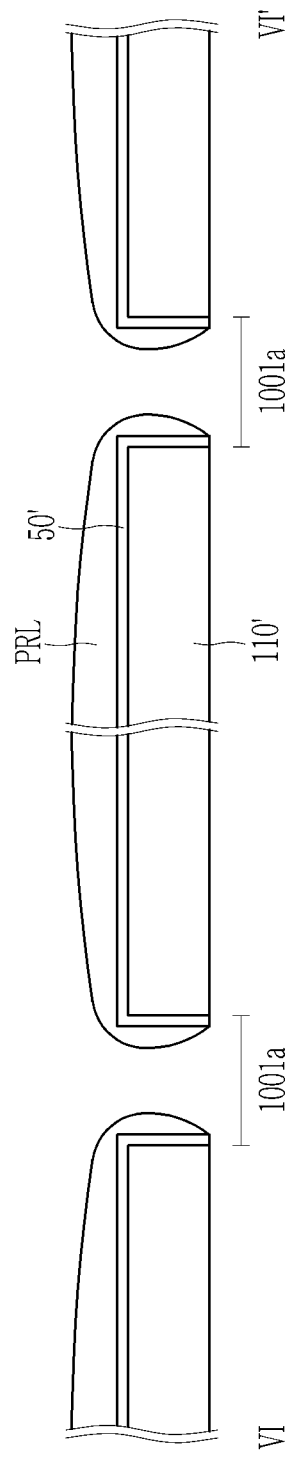
FIG. 6 is a cross-sectional view of a process of the manufacturing method of the display device according to an embodiment, taken along the line VI-VI' of FIG. 5.
Figure 7:
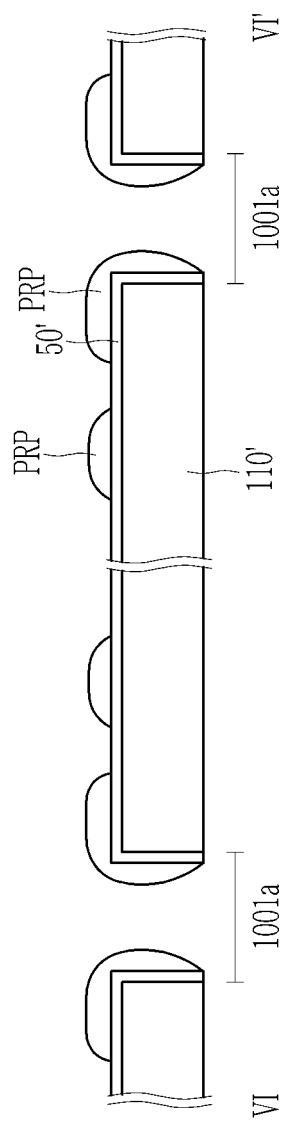
FIG. 7 is a cross-sectional view of a process of the manufacturing method of the display device according to an embodiment, taken along the line VI-VI' of FIG. 5.
Figure 8:
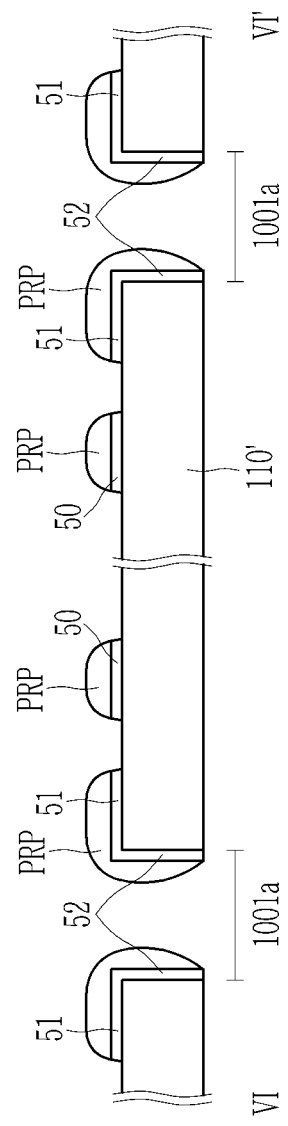
FIG. 8 is a cross-sectional view of a process of the manufacturing method of the display device according to an embodiment, taken along the line VI-VI' of FIG. 5.
Figure 9:
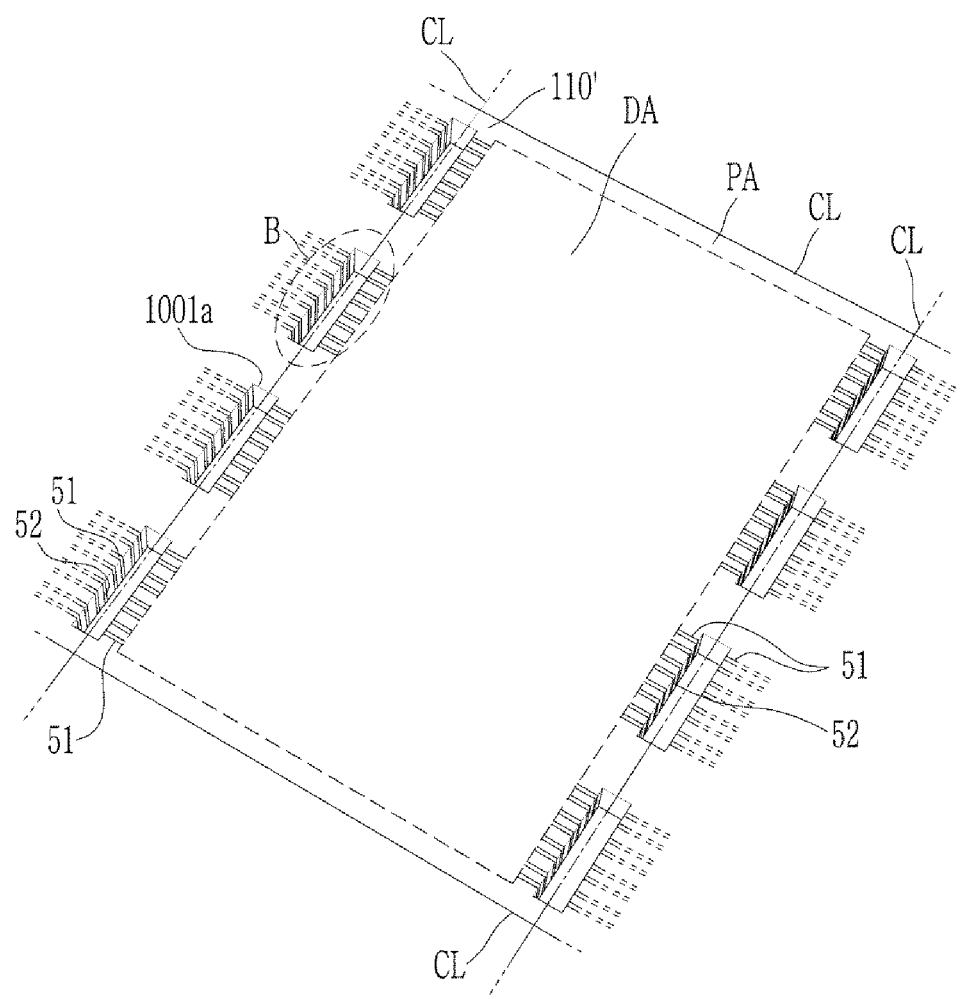
FIG. 9 is an enlarged perspective view of the portion A in FIG. 5 of a process of the manufacturing method of the display device according to an embodiment.
Figure 10:
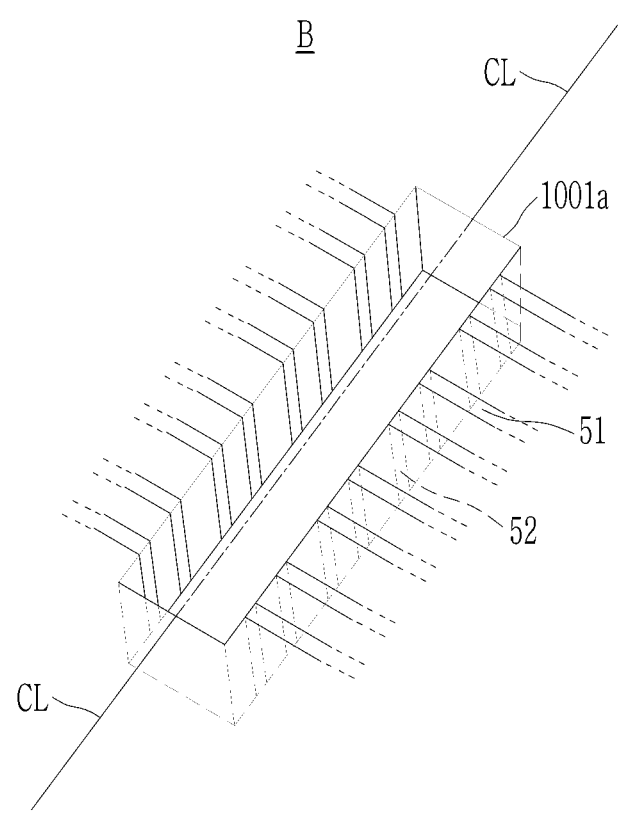
FIG. 10 is an enlarged view of the portion B of FIG. 9 according to an embodiment.
Figure 11:
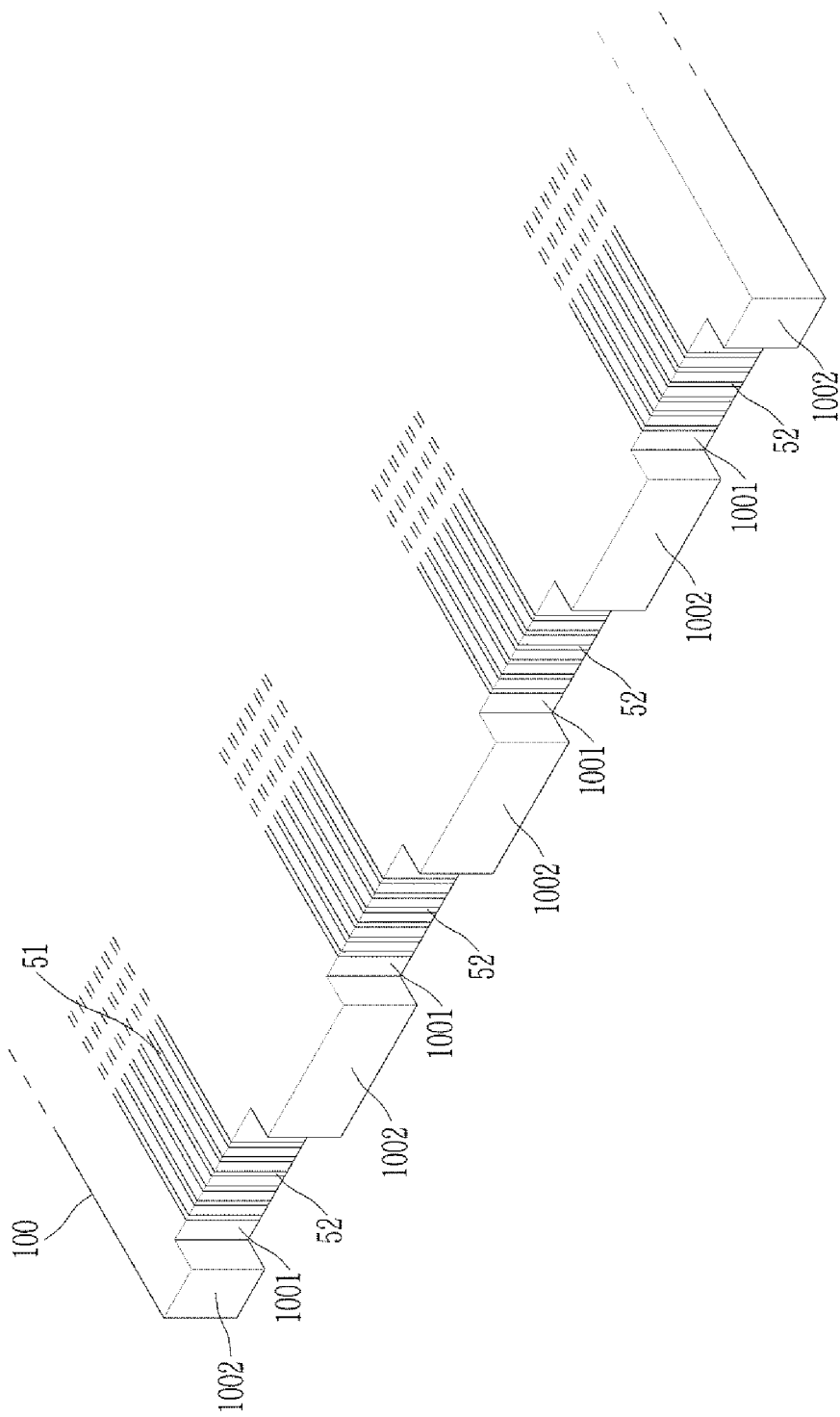
FIG. 11 is a perspective view of a process of the manufacturing method of an embodiment.
Figure 12:
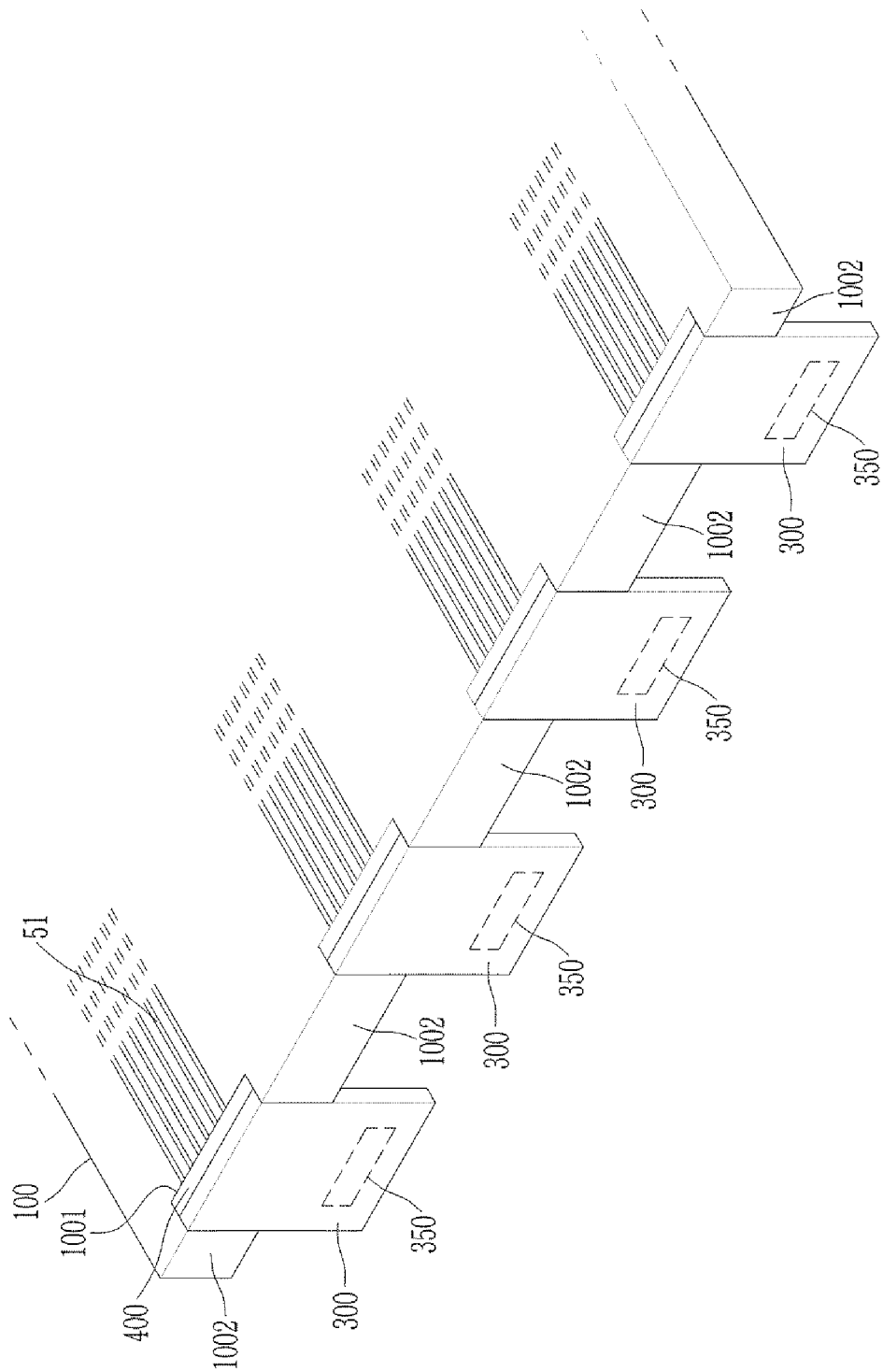
FIG. 12 is a perspective view of a process of the manufacturing method of an embodiment.

Specifically, FIG. 5 is a top plan view of a mother board 11. FIG. 6 to FIG. 8 are cross-sectional views of the respective process stages of the manufacturing method of the display device according to an embodiment, taken along the line VI-VI' of FIG. 5. FIG. 9 is an enlarged perspective view of the portion A in FIG. 5 in one process stage of the manufacturing method of the display device according to an embodiment. FIG. 10 is an enlarged view of the portion B of FIG. 9. FIG. 11 and FIG. 12 are perspective views of the respective process stages of the manufacturing method of the embodiment.

First, referring to FIG. 4 and FIG. 5, penetration holes 1001a are formed in the mother board 11 in an operation S101. The mother board 11 includes cutting lines CL extending in the first direction DR1 and the second direction DR, and includes unit boards 110' partitioned by the cutting lines CL. Each unit board 110' may correspond to a first substrate included in a single display device after cutting of the mother board 11. The cutting lines CL may be lines that are actually disposed in the mother board 11, but this is not restrictive. The cutting lines CL may be virtual lines. Alternatively, the cutting lines CL may be displayed on the mother board 11 in a form other than a line, and may have any shape indicating the cutting position.

Each penetration hole 1001a may be formed to penetrate the mother board 11 in a thickness direction of the mother board 11. The penetration holes 1001a may be formed in a line along the cutting line CL. The penetration holes 1001a may be formed to overlap the cutting line CL. Referring to FIG. 9 and FIG. 10, since the penetration holes 1001a are formed along the cutting line CL, the cutting line CL is positioned on inner walls of the penetration holes 1001a formed in the mother board 11, and may also extend in the thickness direction of the mother board 11. A portion of one penetration hole 1001a may be positioned in one of two adjacent unit boards 110', and the remaining portion of one penetration hole 1001a may be formed in the other of the two unit boards 110'.

Next, referring to FIG. 4 and FIG. 6, a conductive layer 50' and a photoresist layer PRL are formed on the mother board 11 in an operation S102. The conductive layer 50' and the photoresist layer PRL are also formed on the inner wall of the penetration hole 1001a. The photoresist layer PRL may be made of a positive type or a negative type resist.

Next, referring to FIGS. 4 and 7, the photoresist layer PRL is exposed and developed to form a photoresist pattern PRP in an operation S103. A photomask may be used when forming the photoresist pattern PRP. A photomask having a transmissive portion and a blocking portion may be disposed on the photoresist layer PRL, and light may be provided on the photomask to expose and develop the photoresist layer PRL to form the photoresist pattern PRP. The photomask may be a halftone mask including a transflective portion. The photomask may be used to control the degree of light transmission for each region, and the photoresist layer PRL positioned on the top surface of the mother board 11 and the inner wall of the penetration hole 1001a may be exposed and developed together.

When the photoresist layer PRL is made of a positive resist, the exposed portion of the photoresist layer PRL is removed. In this case, the photomask has a blocking portion in a region corresponding to the region where the wiring is to be formed. On the other hand, when the photoresist layer PRL is made of a negative resist, the exposed portion of the photoresist layer PRL remains. In this case, the photomask has a transmissive portion in the region corresponding to the region where the wiring is to be formed.

Next, referring to FIG. 4, FIG. 8, FIG. 9, and FIG. 10, the conductive layer 50' is etched to form conductive patterns 50, 51, and 52, and the photoresist pattern PRP is removed in an operation S104. At this time, the conductive layer 50' positioned on the inner wall of the penetration hole 1001a is also etched. The conductive patterns 50, 51, and 52 may be the first wiring layer or the second wiring layer of FIGS. 2 and 3. The conductive patterns 50, 51, and 52 include a wiring pattern 50, an extension wire 51, and a pad 52. When the conductive patterns 50, 51, and 52 are the first wiring layer of FIG. 3, the extension wire 51 and the pad 52 may include the second extension wire 51b and the second pad 53b of the display device 10 of FIG. 3. When the conductive patterns 50, 51, and 52 are the second wiring layer of FIG. 2, the extension wire 51 and the pad 52 may include the first extension wire 51a and the first pad 52a of the display device 10 of FIG. 2.

Next, referring to FIG. 4 and FIG. 11, the mother board 11 is cut along the cutting line CL in an operation S105. The mother board 11 may be cut in a thickness direction of the mother board 11 along the cutting line CL. The mother board 11 is cut so as to pass through the penetration holes 1001a arranged in a line, and the side surface of the first display panel 100 surrounding the penetration holes 1001a form recess portions 1001, and the cut surface forms the protrusions 1002. Pads 52 are disposed in the recess portions 1001 of the first display panel 100.

The manufacturing method may further include bonding the second display panel 200 before cutting the mother board 11.

Next, referring to FIG. 4 and FIG. 12, the flexible printed circuit board 300 is bonded to the recess portion 1001 of the first display panel 100 in an operation S106. The anisotropic conductive film 400 is positioned between the recess portion 1001 of the first display panel 100 and the flexible printed circuit board 300. The flexible printed circuit board 300 is compressed by pressing at a high pressure or a high temperature and is thus bonded to the first display panel 100, and the pad 52 and the flexible printed circuit board 300 may be electrically connected to the display panel 100. The protrusions 1002 of the first display panel 100 are disposed between the bonded flexible printed circuit boards 300.

Figure 13:
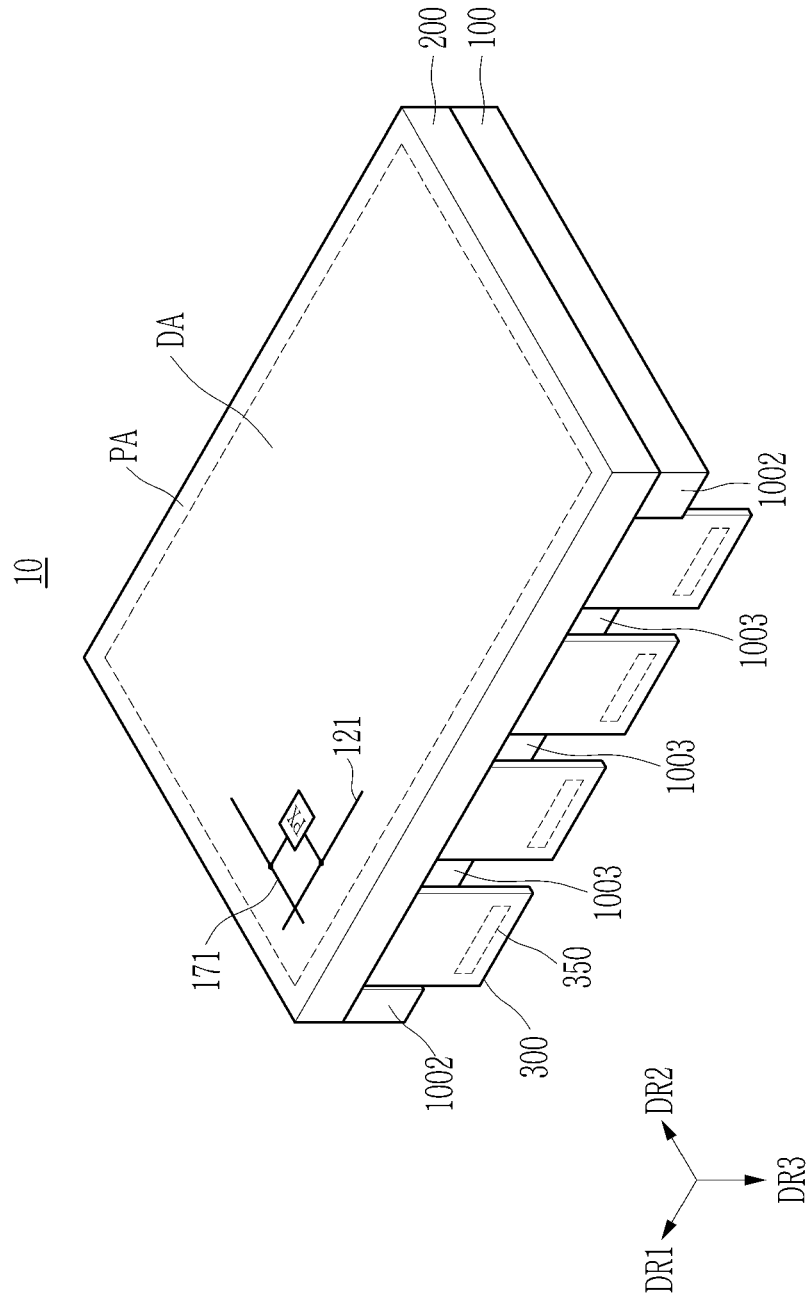
FIG. 13 is a perspective view of a display device according to an embodiment.

Hereinafter, referring to FIG. 13, the display device 10 according to an embodiment will be described. FIG. 13 is a perspective view of the display device 10 according to an embodiment.

Referring to FIG. 13, a first display panel 100 includes recess portions 1003 positioned along a side surface of the first display panel 100, and protrusions 1002 disposed at opposite sides of the recess portions 1003. Each recess portion 1003 is a groove formed in the side surface of the first display panel 100, and the protrusion 1002 is a portion that protrudes relative to the recess portions 1003.

The flexible printed circuit board 300 is bonded to the recess portions 1003 of the first display panel 100. The recess portions 1003 of the first display panel 100 may extend from a region to which the flexible printed circuit board 300 at one end is bonded, to a region to which the flexible printed circuit board 300 at the other end is bonded. That is, no protrusion 1002 may be included between the flexible printed circuit boards 300.

Hereinafter, a manufacturing method of the display device 10 according to an embodiment will be described with reference to FIG. 14 to FIG. 16. A manufacturing method of the display device 10 according to an embodiment is similar to the contents described with reference to FIG. 4 to FIG. 12, and therefore a duplicated description will be omitted.

Figure 14:
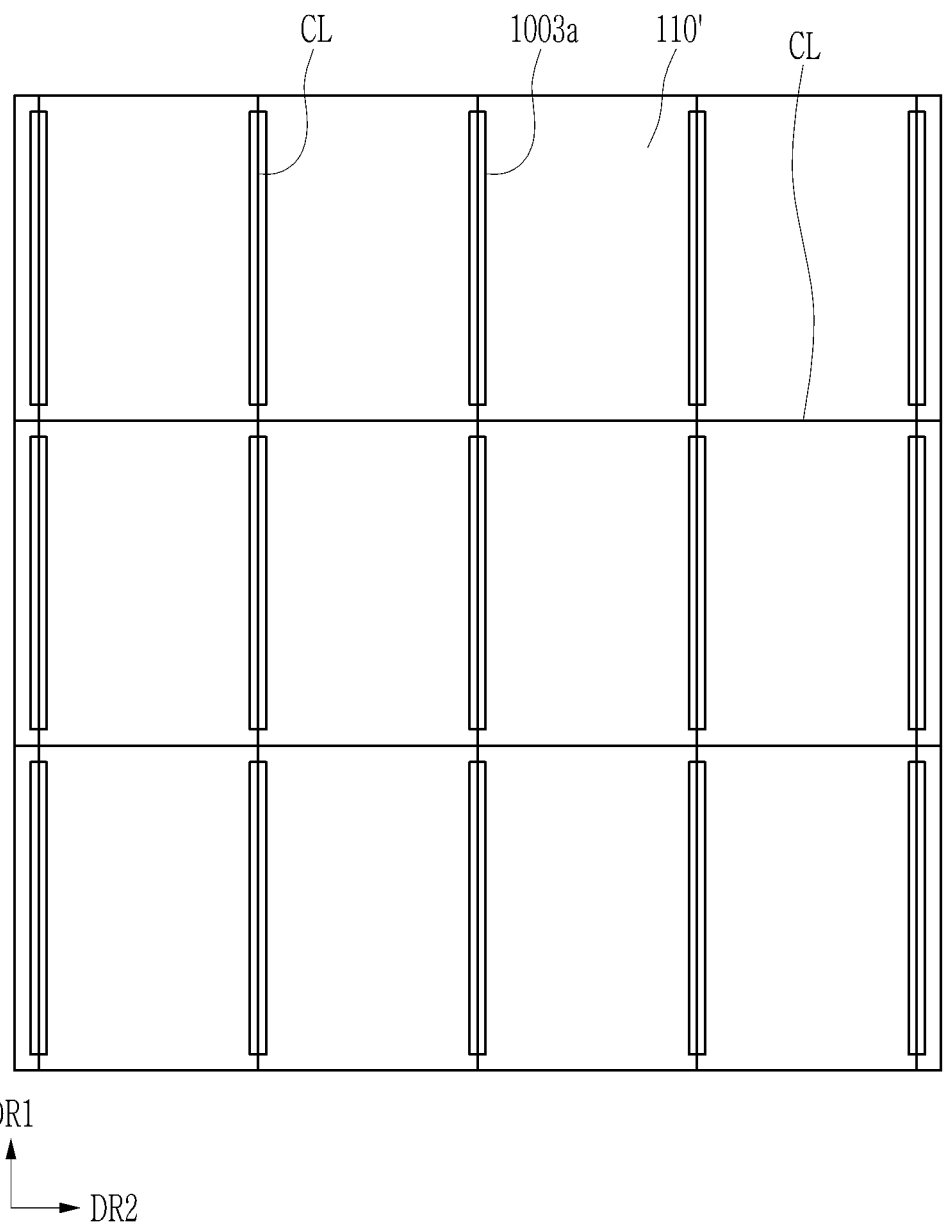
FIG. 14 is a top plan view of a mother board according to an embodiment.
Figure 15:
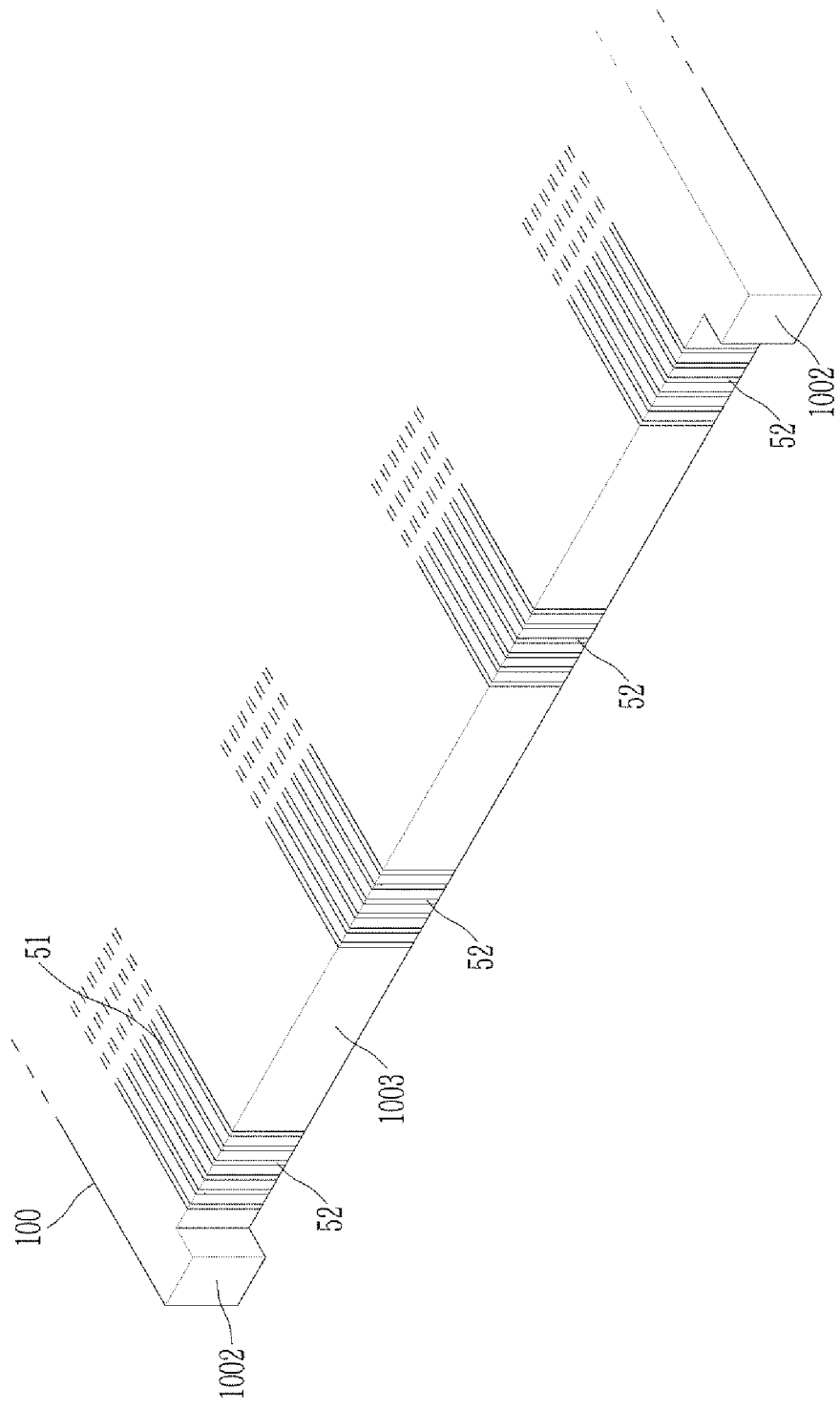
FIG. 15 is a perspective view of a process of the manufacturing method of an embodiment.

FIG. 14 is a top plan view of the mother board 11. FIG. 15 and FIG. 16 are perspective view of process stages of the manufacturing method of the display device according to an embodiment.

First, referring to FIG. 4 and FIG. 14, penetration holes 1003a are formed in the mother board 11 in an operation S101. The penetration hole 1003a is formed to extend along one side of a unit board 110'. Next, a conductive layer and a photoresist layer are formed on the mother board 11 in an operation S102, the photoresist layer is exposed and developed to form a photoresist pattern in an operation S103, and the conductive layer is etched to form conductive patterns 50, 51, and 52 and then the photoresist pattern is removed in an operation S104.

Subsequently, referring to FIG. 4 and FIG. 15, the mother board 11 is cut along cutting lines CL in an operation S105.

The mother board 11 is cut through the penetration holes 1003a in the extension direction of the penetration holes 1003a, and the side surface of the first display panel 100 surrounding the penetration holes 1003a form the recess portions 1003 and the cut surface forms the protrusions 1002. Pads 52 are disposed in the recess portions 1003 of the first display panel 100.

The manufacturing method may further include bonding the second display panel 200 before cutting the mother board 11.

Figure 16:
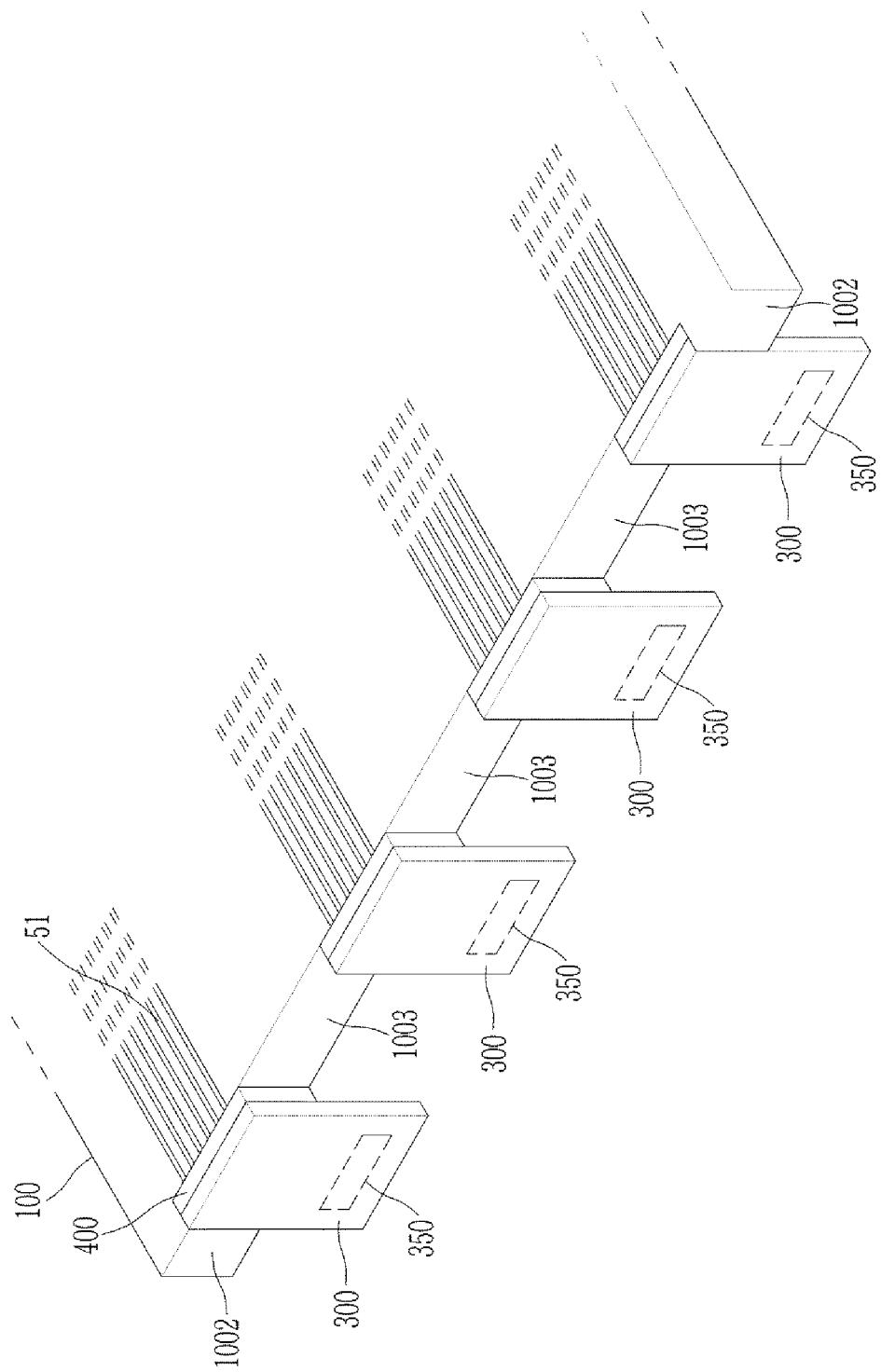
FIG. 16 is a perspective view of a process of the manufacturing method of an embodiment.

Next, referring to FIG. 4 and FIG. 16, the flexible printed circuit board 300 is bonded to the recess portion 1003 of the first display panel 100 in an operation S106. The anisotropic conductive film 400 is positioned between the recess portion 1003 of the first display panel 100 and the flexible printed circuit board 300. The flexible printed circuit board 300 is compressed by pressing at a high pressure or a high temperature and is thus bonded to the first display panel 100, and the pad 52 and the flexible printed circuit board 300 may be electrically connected to the display panel 100. One or more flexible printed circuit boards 300 may be bonded to a single recess portion 1003.

While this disclosure has been described in connection with what is presently considered to be practical embodiments, it is to be understood that the inventive concept is not limited to the disclosed embodiments. On the contrary, it is intended to cover various modifications and equivalents included within the spirit and scope of the appended claims.

DESCRIPTION OF SYMBOLS

| | |
|---|---|
| 10: display device | 100: first display panel |
| 1001, 1003: recess portion | 1002: protruding portion |
| 1001a, 1003a: penetration hole | 11: mother board |
| 110: first substrate | 110': unit board |
| 121: gate line | 124: gate electrode |
| 140: gate insulation layer | 154: semiconductor layer |
| 160: first insulation layer | 170: color filter |
| 171: data line | 180: organic insulator |
| 191: pixel electrode | 200: second display panel |
| 210: second substrate | 270: common electrode |
| 3: liquid crystal layer | 300: flexible printed circuit board |
| 35: sealant | 350: driver IC |
| 400: anisotropic conductive film | 50: wiring pattern |
| 50': conductive layer | 51: extension wire |
| 51a: first extension wire | 51b: second extension wire |
| 52: pad | 52a: first pad |
| 52b: second pad | CL: cutting line |
| DA: display area | PA: peripheral area |

What is claimed is:

1. A display device comprising:
   a display panel; and
   a first flexible printed circuit board bonded to a side surface of the display panel,
   wherein the display panel comprises:
   a first substrate;
   a first extension wire on a top surface of the first substrate, the top surface being parallel to a first direction and a second direction, the second direction being perpendicular to the first direction;
a first recess portion at a side surface of the first substrate; and
a first pad that extends from the first extension wire in a third direction perpendicular to the first and second directions, the first pad being disposed in the first recess portion, and
the first extension wire and the first pad comprise the same material.

2. The display device of claim 1, wherein the display panel further comprises a data line that transmits a data voltage, and
the first extension wire is disposed in the same layer as the data line.

3. The display device of claim 1, wherein the display panel further comprises a gate line that transmits a gate signal, and
the first extension wire is disposed in the same layer as the gate line.

4. The display device of claim 1, wherein the first flexible printed circuit board is bonded to the first recess portion and is connected with the first pad.

5. The display device of claim 4, further comprising a second flexible printed circuit board that is bonded to a side surface of the display panel,
wherein the display panel further comprises:
a second recess portion at the side surface of the first substrate;
a second extension wire on the top surface of the first substrate; and
a second pad that extends in the third direction from the second extension wire, the second pad being disposed in the second recess portion, and
the second flexible printed circuit board is bonded to the second recess portion and is connected with the second pad.

6. The display device of claim 5, wherein the display panel further comprises a first protrusion that is disposed between the first recess portion and the second recess portion.

7. The display device of claim 5, further comprising an anisotropic conductive film between the first flexible printed circuit board and the first pad.

8. The display device of claim 4, further comprising a second flexible printed circuit board bonded to the side surface of the display panel,
wherein the second flexible printed circuit board is bonded to the first recess portion.

9. The display device of claim 4, wherein the first flexible printed circuit board comprises a driver integrated circuit (IC).

10. A manufacturing method of a display device, comprising:
forming penetration holes along a cutting line of a mother board;
forming a conductive layer and a photoresist layer on the mother board;
forming a photoresist pattern by developing and exposing the photoresist layer;
forming a conductive pattern by etching the conductive layer; and
cutting the mother board along the cutting line so as to pass through the penetration holes,
wherein, in the forming of the conductive pattern,
an extension wire is formed on the mother board, pads are formed on the inner walls of the penetration holes, and
a data line that transmits a data voltage or a gate line that transmits a gate signal is formed on the mother board.

11. The manufacturing method of the display device of claim 10, wherein the conductive layer is disposed on a top surface of the mother board and is disposed on inner walls of the penetration holes, the forming the conductive pattern comprising the etching the conductive layer.

12. The manufacturing method of the display device of claim 11, wherein, in the forming of the conductive pattern, data lines and the pads are simultaneously formed on the mother board.

13. The manufacturing method of the display device of claim 11, wherein, in the forming of the conductive pattern, gate lines and the pads are simultaneously formed on the mother board.

14. The manufacturing method of the display device of claim 11, wherein, in the cutting of the mother board, the mother board is cut into unit boards, and each unit board comprises a first recess portion formed by cutting a first penetration hole among the penetration holes.

15. The manufacturing method of the display device of claim 14, wherein, in the cutting of the mother board, the unit board comprises a second recess portion formed by cutting a second penetration hole among the penetration holes.

16. The manufacturing method of the display device of claim 15, further comprising bonding a flexible printed circuit board after the cutting of the mother board,
wherein the bonding the flexible printed circuit board is carried out by bonding a first flexible printed circuit board to the first recess portion and bonding a second flexible printed circuit board to the second recess portion.

17. The manufacturing method of the display device of claim 15, wherein, in the cutting of the mother board, a protrusion is formed between the first recess portion and the second recess portion.

18. The manufacturing method of the display device of claim 14, further comprising bonding flexible printed circuit boards to the first recess portion after the cutting of the mother board.

19. The manufacturing method of claim 16, wherein the bonding the flexible printed circuit board is carried out by positioning an anisotropic conductive film between the flexible printed circuit board and the pads and performing compression at a high pressure or a high temperature.

* * * * *